United States Patent
Okita et al.

(10) Patent No.: US 10,872,759 B2
(45) Date of Patent: Dec. 22, 2020

(54) SILICON CARBIDE SINGLE CRYSTAL SUBSTRATE AND METHOD FOR MANUFACTURING THE SAME

(71) Applicant: Sumitomo Electric Industries, Ltd., Osaka (JP)

(72) Inventors: Kyoko Okita, Itami (JP); Tsubasa Honke, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 2 days.

(21) Appl. No.: 15/509,020

(22) PCT Filed: Jun. 24, 2015

(86) PCT No.: PCT/JP2015/068144
§ 371 (c)(1),
(2) Date: Mar. 6, 2017

(87) PCT Pub. No.: WO2016/038980
PCT Pub. Date: Mar. 17, 2016

(65) Prior Publication Data
US 2017/0256391 A1    Sep. 7, 2017

(30) Foreign Application Priority Data
Sep. 8, 2014   (JP) .................................. 2014-182292

(51) Int. Cl.
*H01L 29/02* (2006.01)
*H01L 21/02* (2006.01)
(Continued)

(52) U.S. Cl.
CPC .......... *H01L 21/02035* (2013.01); *B24B 1/00* (2013.01); *B24B 9/00* (2013.01);
(Continued)

(58) Field of Classification Search
CPC ......... H01L 21/02035; H01L 21/02021; H01L 21/02013; H01L 21/02087; H01L 21/0209;
(Continued)

(56) References Cited

U.S. PATENT DOCUMENTS

| | | | |
|---|---|---|---|
| 5,185,965 A * | 2/1993 | Ozaki | ..................... B24B 9/065 451/14 |
| 5,230,747 A | 7/1993 | Maejima et al. | |

(Continued)

FOREIGN PATENT DOCUMENTS

| | | |
|---|---|---|
| EP | 0832717 A2 | 4/1998 |
| JP | H05-217830 A | 8/1993 |

(Continued)

OTHER PUBLICATIONS

International Search Report in counterpart International Application No. PCT/JP2015/068144, dated Sep. 15, 2015.

*Primary Examiner* — Steven H Loke
*Assistant Examiner* — Samuel Park
(74) *Attorney, Agent, or Firm* — Baker Botts L.L.P.; Michael A. Sartori

(57) ABSTRACT

A silicon carbide single crystal substrate includes a first main surface, a second main surface, and a circumferential edge portion. The second main surface is opposite to the first main surface. The circumferential edge portion connects the first main surface and the second main surface. The circumferential edge portion has a linear orientation flat portion, a first arc portion having a first radius, and a second arc portion connecting the orientation flat portion and the first arc portion and having a second radius smaller than the first radius, when viewed along a direction perpendicular to the first main surface.

3 Claims, 8 Drawing Sheets

(51) Int. Cl.
| | |
|---|---|
| *C30B 29/36* | (2006.01) |
| *B24B 1/00* | (2006.01) |
| *B24B 9/00* | (2006.01) |
| *B24D 5/02* | (2006.01) |
| *B24B 9/06* | (2006.01) |
| *B24D 3/28* | (2006.01) |
| *H01L 29/16* | (2006.01) |
| *B24B 19/22* | (2006.01) |
| *C30B 29/64* | (2006.01) |
| *C30B 33/00* | (2006.01) |
| *C30B 25/20* | (2006.01) |
| *H01L 29/04* | (2006.01) |

(52) U.S. Cl.
CPC .............. *B24B 9/065* (2013.01); *B24B 19/22* (2013.01); *B24D 3/28* (2013.01); *B24D 5/02* (2013.01); *C30B 29/36* (2013.01); *C30B 29/64* (2013.01); *C30B 33/00* (2013.01); *H01L 21/02013* (2013.01); *H01L 21/02021* (2013.01); *H01L 29/1608* (2013.01); *C30B 25/20* (2013.01); *H01L 29/045* (2013.01)

(58) Field of Classification Search
CPC ........... H01L 21/6836; H01L 27/14687; H01L 21/304; H01L 21/463; H01L 21/67092; H01L 41/337; H01L 2221/68327; H01L 2224/03602; H01L 2224/11602; H01L 2224/27602; H01L 2924/0002; H01L 2924/00; H01L 2223/54493; H01L 23/544; H01L 29/1608; H01L 21/78; H01L 2223/54453; H01L 23/562; H01L 29/34; H01L 2221/6834; H01L 2223/54426; H01L 29/04; H01L 21/68707; H01L 29/0657; H01L 21/02378; H01L 21/02433; H01L 21/02529; H01L 21/0262; H01L 21/0475; H01L 21/67; H01L 21/6835; H01L 2223/54433; H01L 2223/5446; H01L 22/12; H01L 22/20; H01L 29/0661; H01L 33/16; H01L 33/32; C30B 33/00; C30B 29/36; C30B 29/64; B24B 19/22; H02G 1/1285

See application file for complete search history.

(56) References Cited

U.S. PATENT DOCUMENTS

| | | | |
|---|---|---|---|
| 8,389,099 B1* | 3/2013 | Matthews | H01L 23/544 |
| | | | 148/33.2 |
| 2001/0033899 A1* | 10/2001 | Noguchi | C23C 16/0254 |
| | | | 427/460 |
| 2005/0061231 A1* | 3/2005 | Stone-Sundberg | C30B 33/00 |
| | | | 117/13 |
| 2006/0057850 A1* | 3/2006 | Britt | H01L 21/6835 |
| | | | 438/690 |
| 2007/0262322 A1* | 11/2007 | Nakabayashi | C30B 23/00 |
| | | | 257/77 |
| 2012/0319249 A1* | 12/2012 | Uchida | H01L 29/045 |
| | | | 257/628 |
| 2013/0099252 A1 | 4/2013 | Sasaki | |
| 2013/0264584 A1 | 10/2013 | Okita et al. | |
| 2015/0334812 A1* | 11/2015 | Mazzocco | H05F 3/04 |
| | | | 414/800 |
| 2016/0005593 A1* | 1/2016 | Yamaguchi | H01L 21/02021 |
| | | | 451/44 |
| 2017/0221697 A1* | 8/2017 | Sasaki | H01J 49/4285 |

FOREIGN PATENT DOCUMENTS

| | | |
|---|---|---|
| JP | H10-100050 A | 4/1998 |
| JP | 2008-098412 A | 4/2008 |
| JP | 2013-089937 A | 5/2013 |
| JP | 2013-219206 A | 10/2013 |

\* cited by examiner

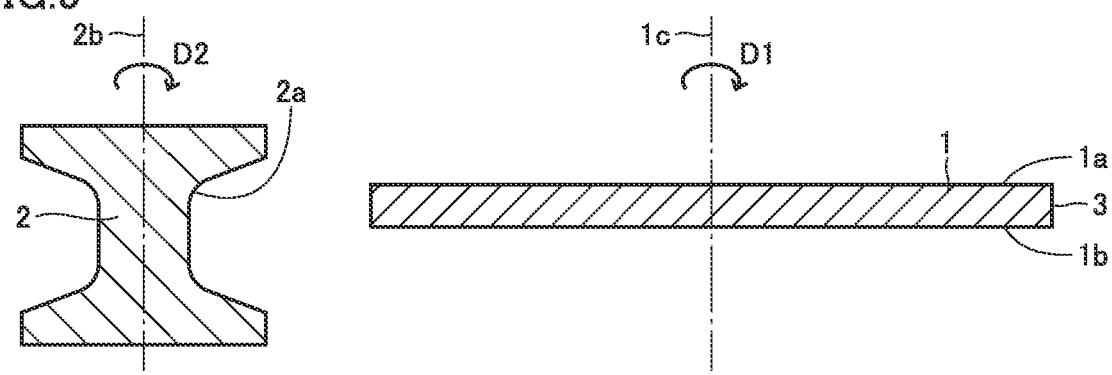
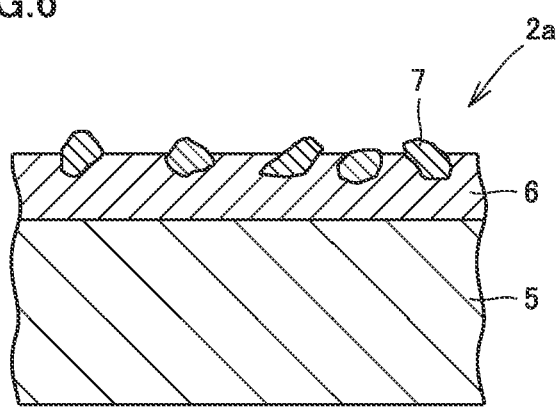

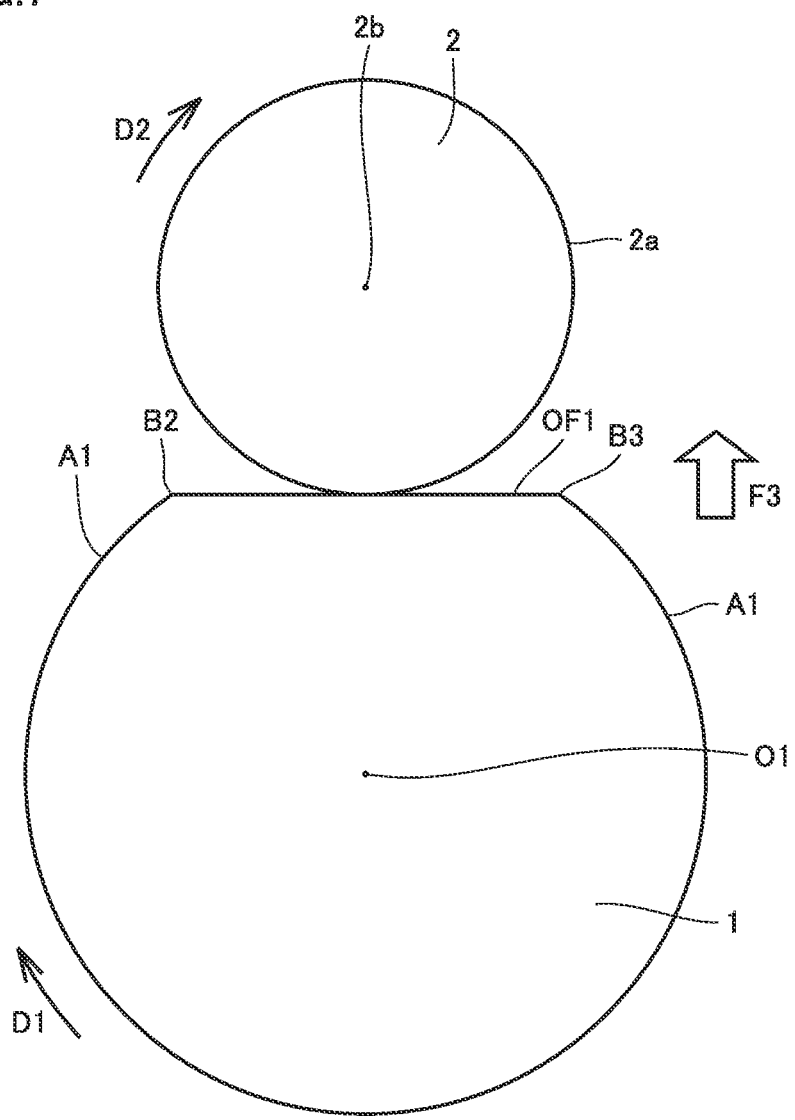

ical field, low loss, and the like in a semiconductor device,
SILICON CARBIDE SINGLE CRYSTAL SUBSTRATE AND METHOD FOR MANUFACTURING THE SAME

TECHNICAL FIELD

The present disclosure relates to a silicon carbide single crystal substrate and a method for manufacturing the same.

BACKGROUND ART

In recent years, in order to achieve high breakdown voltage, low loss, and the like in a semiconductor device, silicon carbide has begun to be adopted as a material constituting the semiconductor device.

For example, Japanese Patent Laying-Open No. 2013-89937 (PTD 1) describes including preparing an ingot made of single crystal silicon carbide, obtaining a silicon carbide substrate by slicing the ingot, and polishing a surface of the silicon carbide substrate.

CITATION LIST

Patent Document

PTD 1: Japanese Patent Laying-Open No. 2013-89937

SUMMARY OF INVENTION

Technical Problem

When a silicon carbide epitaxial film is formed on a silicon carbide single crystal substrate, a level difference (slip) may occur in a surface of the silicon carbide epitaxial film.

An object of the present disclosure is to provide a silicon carbide single crystal substrate capable of suppressing occurrence of a level difference in a surface of a silicon carbide epitaxial film, and a method for manufacturing the same.

Solution to Problem

A silicon carbide single crystal substrate in accordance with the present disclosure includes a first main surface, a second main surface, and a circumferential edge portion. The second main surface is opposite to the first main surface. The circumferential edge portion connects the first main surface and the second main surface. The circumferential edge portion has a linear orientation flat portion, a first arc portion having a first radius, and a second arc portion connecting the orientation flat portion and the first arc portion and having a second radius smaller than the first radius, when viewed along a direction perpendicular to the first main surface.

A method for manufacturing the silicon carbide single crystal substrate in accordance with the present disclosure includes the following. A silicon carbide single crystal substrate having a first main surface, a second main surface opposite to the first main surface, and a circumferential edge portion connecting the first main surface and the second main surface is prepared. The circumferential edge portion has a linear orientation flat portion, a first arc portion having a first radius, and a contact point between the orientation flat portion and the first arc portion, when viewed along a direction perpendicular to the first main surface. Further, the first arc portion, the contact point, and the orientation flat portion are ground while rotating the silicon carbide single crystal substrate. A second arc portion connecting the orientation flat portion and the first arc portion and having a second radius smaller than the first radius is formed by grinding the first arc portion, the contact point, and the orientation flat portion.

Advantageous Effects of Invention

According to the present disclosure, a silicon carbide single crystal substrate capable of suppressing occurrence of a level difference in a surface of a silicon carbide epitaxial film, and a method for manufacturing the same can be provided.

BRIEF DESCRIPTION OF DRAWINGS

FIG. 5 is a schematic cross sectional view showing the first step of the method for manufacturing the silicon carbide single crystal substrate in accordance with the embodiment.

FIG. 6 is a schematic cross sectional view showing a configuration of the vicinity of a grinding surface of a grindstone.

FIG. 7 is a schematic plan view showing a second step of the method for manufacturing the silicon carbide single crystal substrate in accordance with the embodiment.

DESCRIPTION OF EMBODIMENTS

Description of Embodiment

Figure 1:
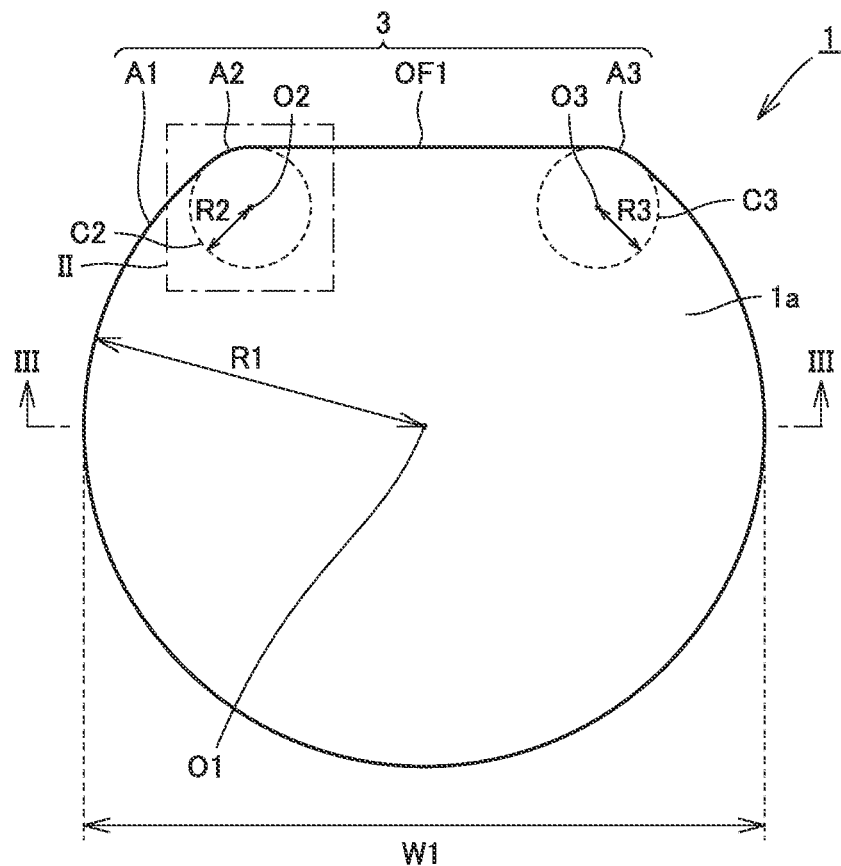
FIG. 1 is a schematic plan view showing a configuration of a silicon carbide single crystal substrate in accordance with an embodiment.

The inventors have conducted diligent studies on the reason why a level difference (slip) occurs in a surface of a silicon carbide epitaxial film when the silicon carbide epitaxial film is formed on a silicon carbide single crystal substrate, and as a result, have obtained the following findings.

For example, when the silicon carbide single crystal substrate is placed on a susceptor for forming the epitaxial film, the vicinity of a contact point between an orientation flat portion and an arc-shaped circumferential edge portion may come into contact with the susceptor, and thereby the vicinity of the contact point may be damaged. If the damage is serious, chipping occurs in the vicinity of the contact point. A level difference which occurs in the surface of the epitaxial film is attributed to the damage which occurs in the vicinity of the contact point.

As a result of the diligent studies, the inventors have found that the damage in the vicinity of the contact point can be removed and occurrence of a level difference in the surface of the epitaxial film formed on the silicon carbide single crystal substrate can be effectively suppressed by chamfering the vicinity of the contact point and forming an arc portion having a second radius smaller than a first radius of the arc-shaped circumferential edge portion.

(1) A silicon carbide single crystal substrate 1 in accordance with the present disclosure includes a first main surface 1a, a second main surface 1b, and a circumferential edge portion 3. Second main surface 1b is opposite to first main surface 1a. Circumferential edge portion 3 connects first main surface 1a and second main surface 1b. Circumferential edge portion 3 has a linear orientation flat portion OF1, a first arc portion A1 having a first radius R1, and a second arc portion A2 connecting orientation flat portion OF1 and first arc portion A1 and having a second radius R2 smaller than first radius R1, when viewed along a direction perpendicular to first main surface 1a. Thereby, occurrence of a level difference in a surface of a silicon carbide epitaxial film formed on silicon carbide single crystal substrate 1 can be effectively suppressed.

(2) Preferably, in silicon carbide single crystal substrate 1 in accordance with (1) described above, second radius R2 is more than or equal to 50 μm and less than or equal to 500 μm. When second radius R2 is more than or equal to 50 μm, damage in the vicinity of a contact point can be removed effectively, and thus occurrence of a level difference in the surface of the epitaxial film can be suppressed more effectively. When second radius R2 is less than or equal to 500 μm, occurrence of misalignment due to too short linear orientation flat portion OF1 can be suppressed.

(3) Preferably, in silicon carbide single crystal substrate 1 in accordance with (1) or (2) described above, first main surface 1a has a maximum diameter W1 of more than or equal to 100 mm and less than or equal to 200 mm. When first main surface 1a has large maximum diameter W1, an angle formed by first arc portion A1 and orientation flat portion OF1 becomes small and the vicinity of the contact point becomes sharp, and thus chipping is likely to occur in the vicinity of the contact point. Therefore, it is possible to particularly effectively suppress occurrence of a level difference in the surface of the silicon carbide epitaxial film in silicon carbide single crystal substrate 1 whose first main surface 1a has maximum diameter W1 of more than or equal to 100 mm and less than or equal to 200 mm.

(4) Preferably, in silicon carbide single crystal substrate 1 in accordance with any of (1) to (3) described above, a material constituting silicon carbide single crystal substrate 1 is hexagonal silicon carbide. Orientation flat portion OF1 is located in a [1-100] direction when viewed from a center of gravity G of silicon carbide single crystal substrate 1. In this case, second arc portion A2 is located in a [11-20] direction when viewed from center of gravity G. Hexagonal silicon carbide has a property that it is easily cleaved at a position in a [11-20] orientation. Accordingly, chipping can be effectively suppressed by providing second arc portion A2 at that position.

(5) A method for manufacturing silicon carbide single crystal substrate 1 in accordance with the present disclosure includes the following. Silicon carbide single crystal substrate 1 having first main surface 1a, second main surface 1b opposite to first main surface 1a, and circumferential edge portion 3 connecting first main surface 1a and second main surface 1b is prepared. Circumferential edge portion 3 has linear orientation flat portion OF1, first arc portion A1 having first radius R1, and a contact point B2 between orientation flat portion OF1 and first arc portion A1, when viewed along the direction perpendicular to first main surface 1a. Further, first arc portion A1, contact point B2, and orientation flat portion OF1 are ground while rotating silicon carbide single crystal substrate 1. Second arc portion A2 connecting orientation flat portion OF1 and first arc portion A1 and having second radius R2 smaller than first radius R1 is formed by grinding first arc portion A1, contact point B2, and orientation flat portion OF1. Thereby, occurrence of a level difference in the surface of the silicon carbide epitaxial film formed on silicon carbide single crystal substrate 1 can be effectively suppressed.

(6) Preferably, in the method for manufacturing silicon carbide single crystal substrate 1 in accordance with (5) described above, grinding first arc portion A1, contact point B2, and orientation flat portion OF1 includes grinding first arc portion A1 while pressing first arc portion A1 against a grindstone 2 with a first force, grinding contact point B2 while pressing contact point B2 against grindstone 2 with a second force, and grinding orientation flat portion OF1 while pressing orientation flat portion OF1 against the grindstone with a third force. The second force is greater than the first force, and the third force is greater than the second force. Thereby, second arc portion A2 can be efficiently formed while preventing a crack and a chip in silicon carbide single crystal substrate 1.

(7) Preferably, in the method for manufacturing silicon carbide single crystal substrate 1 in accordance with (6) described above, a binder 6 of grindstone 2 is a resin. Binder 6 using a resin is highly strong and highly elastic, and thus can be more suitably used for grinding under a high circumferential speed condition than a binder using a metal.

(8) Preferably, in the method for manufacturing silicon carbide single crystal substrate 1 in accordance with (6) or (7) described above, a grinding surface 2a of grindstone 2 abutting on circumferential edge portion 3 has an abrasive grain density of more than or equal to 25 volume % and less than or equal to 32.5 volume %. Thereby, second arc portion A2 can be efficiently formed by excessively pressing circumferential edge portion 3 against grinding surface 2a of grindstone 2 with cutting ability being enhanced.

(9) Preferably, in the method for manufacturing silicon carbide single crystal substrate 1 in accordance with any of (5) to (8) described above, in grinding first arc portion A1, contact point B2, and orientation flat portion OF1, first arc portion A1, contact point B2, and orientation flat portion OF1 are ground while rotating silicon carbide single crystal substrate 1. A rotation speed of silicon carbide single crystal substrate 1 in grinding contact point B2 is lower than a rotation speed of silicon carbide single crystal substrate 1 in each of grinding first arc portion A1 and grinding orientation flat portion OF1. Thereby, second arc portion A2 can be efficiently formed while preventing a crack and a chip in silicon carbide single crystal substrate 1.

(10) Preferably, in the method for manufacturing silicon carbide single crystal substrate 1 in accordance with any of (5) to (9) described above, in grinding first arc portion A1, contact point B2, and orientation flat portion OF1, an entire circumference of circumferential edge portion 3 is chamfered. Thereby, silicon carbide single crystal substrate 1 having circumferential edge portion 3 whose circumference is entirely chamfered can be formed.

(11) Preferably, in the method for manufacturing silicon carbide single crystal substrate 1 in accordance with any of (5) to (10) described above, first main surface 1a has a maximum diameter of more than or equal to 100 mm and less than or equal to 200 mm. When first main surface 1a has large maximum diameter W1, the angle formed by first arc portion A1 and orientation flat portion OF1 becomes small and the vicinity of the contact point becomes sharp, and thus chipping is likely to occur in the vicinity of the contact point. Therefore, it is possible to particularly effectively suppress occurrence of a level difference in the surface of the silicon carbide epitaxial film in silicon carbide single crystal substrate 1 whose first main surface 1a has maximum diameter W1 of more than or equal to 100 mm and less than or equal to 200 mm.

Details of Embodiment

Hereinafter, an embodiment will be described with reference to the drawings. It should be noted that, in the drawings below, identical or corresponding parts will be designated by the same reference numerals, and the description thereof will not be repeated. Regarding crystallographic indications in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification.

First, a structure of silicon carbide single crystal substrate 1 in accordance with the embodiment will be described.

Figure 2:
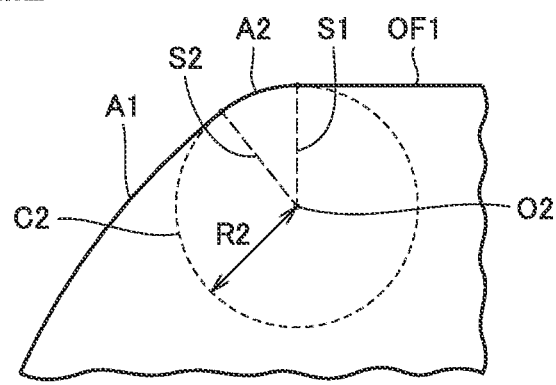
FIG. 2 is an enlarged view of a region II in FIG. 1.
Figure 3:
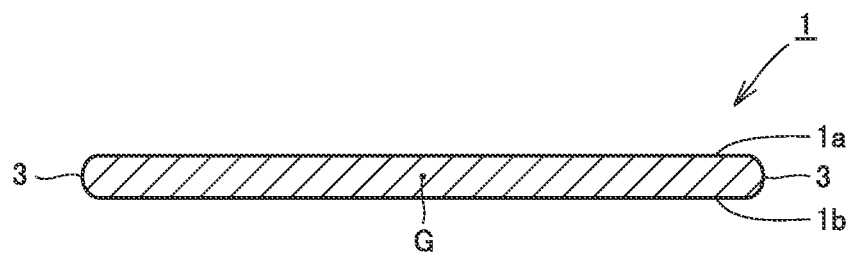
FIG. 3 is a schematic cross sectional view taken along a line in FIG. 1.

Referring to FIGS. 1 to 3, silicon carbide single crystal substrate 1 mainly has first main surface 1a, second main surface 1b opposite to first main surface 1a, and circumferential edge portion 3. Circumferential edge portion 3 is a chamfered portion connecting first main surface 1a and second main surface 1b. Referring to FIG. 3, when viewed along a direction parallel to first main surface 1a (viewed in a cross sectional view), first main surface 1a is substantially parallel to second main surface 1b. When viewed in a cross sectional view, circumferential edge portion 3 is protrudingly curved. A material constituting silicon carbide single crystal substrate 1 is preferably hexagonal silicon carbide, and more preferably hexagonal silicon carbide having a polytype of 4H. Silicon carbide single crystal substrate 1 includes an n type impurity such as nitrogen (N), for example, and may have an n type conductivity type. First main surface 1a of silicon carbide single crystal substrate 1 is, for example, a {0001}plane, or a plane having an off angle of less than or equal to about 8° from the {0001}plane. First main surface 1a of silicon carbide single crystal substrate 1 is, for example, a (0001) plane, or a plane having an off angle of less than or equal to about 8° from the (0001) plane, and second main surface 1b is a (000-1) plane, or a plane having an off angle of less than or equal to about 8° from the (000-1) plane. First main surface 1a of silicon carbide single crystal substrate 1 may be, for example, a (000-1) plane, or a plane having an off angle of less than or equal to about 8° from the (000-1) plane, and second main surface 1b may be a (0001) plane, or a plane having an off angle of less than or equal to about 8° from the (0001) plane.

Referring to FIG. 1, maximum diameter W1 of first main surface 1a is, for example, more than or equal to 100 mm and less than or equal to 200 mm, and preferably more than or equal to 150 mm and less than or equal to 200 mm. When viewed along the direction perpendicular to first main surface 1a (viewed in a plan view), circumferential edge portion 3 has linear orientation flat portion OF1, first arc portion A1, second arc portion A2, and a third arc portion A3. For example, in cases where maximum diameter W1 of first main surface 1a is 100 mm (4 inches) and 150 mm (6 inches), the length of orientation flat portion OF1 in the direction parallel to first main surface 1a is, for example, about 32.5 mm and about 47.5 mm, respectively. First arc portion A1 has first radius R1. In other words, first arc portion A1 is a portion of a circumference of a circle which has a center O1 and has first radius R1. First radius R1 is, for example, more than or equal to 50 mm and less than or equal to 100 mm.

Referring to FIG. 2, second arc portion A2 is formed to connect orientation flat portion OF1 and first arc portion A1. Second arc portion A2 has second radius R2 smaller than first radius R1. In other words, a circle C2 formed along second arc portion A2 has second radius R2 smaller than first radius R1. A region surrounded by line segments S1 and S2 and second arc portion A2 is fan-shaped, line segment S1 connecting a center O2 and a contact point between second arc portion A2 and orientation flat portion OF1, line segment S2 connecting center O2 and a contact point between second arc portion A2 and first arc portion A1. Second arc portion A2 is a portion of a circumference of circle C2 which has center O2 and has second radius R2. Second radius R2 is preferably more than or equal to 50 μm and less than or equal to 500 μm, and more preferably more than or equal to 100 μm and less than or equal to 250 μm.

Referring to FIG. 1, second arc portion A2 is connected to one end portion of linear orientation flat portion OF1, and third arc portion A3 is connected to the other end portion of linear orientation flat portion OF1. As with second arc portion A2, third arc portion A3 is formed to connect orientation flat portion OF1 and first arc portion A1. Third arc portion A3 has a third radius R3 smaller than first radius R1. Third arc portion A3 is a portion of a circumference of a circle C3 which has a center O3 and has third radius R3. Third radius R3 is substantially identical to second radius R2. It should be noted that each of first radius R1, second radius R2, and third radius R3 can be measured by obtaining an image of first main surface 1a from the first main surface 1a side.

Orientation flat portion OF1 is located, for example, in the [1-100] direction when viewed from center of gravity G of silicon carbide single crystal substrate 1. When viewed in a plan view, the [1-100] direction is a direction perpendicular to a direction in which the linear orientation flat portion extends, for example. In this case, second arc portion A2 is located in the [11-20] direction, when viewed from center of gravity G. Since hexagonal silicon carbide has a property that it is easily cleaved at a position in the [11-20] orientation, it is preferable to chamfer hexagonal silicon carbide at that position so as to have a curvature when viewed in a plan view and have a curvature when viewed in a cross sectional view. It should be noted that a silicon carbide epitaxial film (not shown) may be provided on one of first main surface 1a and second main surface 1b of silicon carbide single crystal substrate 1.

Figure 13:
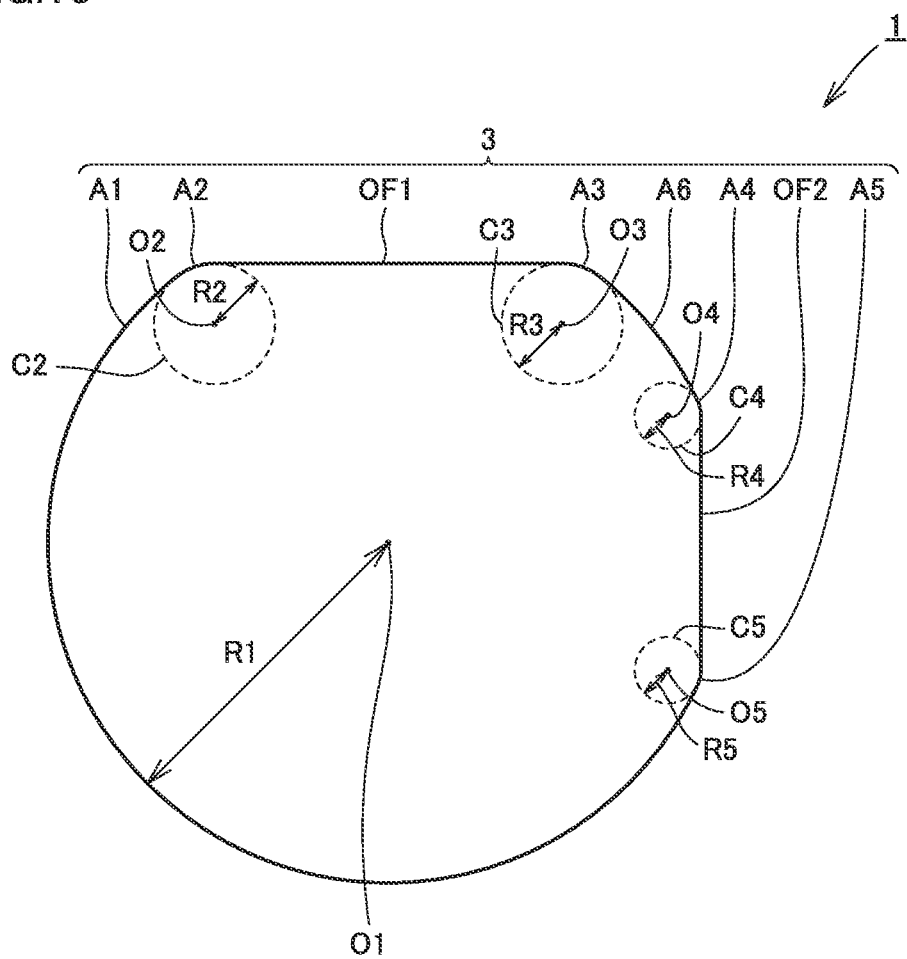
FIG. 13 is a schematic plan view showing a configuration of a variation of the silicon carbide single crystal substrate in accordance with the embodiment.

Referring to FIG. 13, a configuration of a variation of silicon carbide single crystal substrate 1 in accordance with the present embodiment will be described.

As shown in FIG. 13, circumferential edge portion 3 may further have a second orientation flat portion OF2, a fourth arc portion A4, and a fifth arc portion A5. Second orientation flat portion OF2 is located, for example, in a [−1−120] direction when viewed from center of gravity G of silicon carbide single crystal substrate 1. When viewed in a plan view, the [−1−120] direction is a direction perpendicular to a direction in which the linear orientation flat portion extends, for example. When viewed in a plan view, the length of a linear portion of second orientation flat portion OF2 is shorter than the length of a linear portion of orientation flat portion OF1.

Fourth arc portion A4 is connected to one end portion of second orientation flat portion OF2, and fifth arc portion A5 is connected to the other end portion of second orientation flat portion OF2. Fourth arc portion A4 is a portion of a circle C4 which has a center O4 and a fourth radius R4. Fifth arc portion A5 is a portion of a circle C5 which has a center O5 and a fifth radius R5. Preferably, each of fourth radius R4 and fifth radius R5 is smaller than second radius R2. Circumferential edge portion 3 may have a sixth arc portion A6 between third arc portion A3 and fourth arc portion A4 when viewed in a plan view. The radius of sixth arc portion A6 may be substantially identical to first radius R1 of first arc portion A1.

Next, a method for measuring the radius of each arc portion will be described.

The radius of each arc portion can be measured, for example, with an edge profile monitor manufactured by Kobelco Research Institute (model number: LEP-2000). Specifically, an image of first main surface 1a of silicon carbide single crystal substrate 1 is obtained using the edge profile monitor. An arc portion (for example, second arc portion A2: see FIG. 2) is identified from the obtained image. A circle (for example, circle C2: see FIG. 2) is fitted to the arc portion such that maximum overlap is obtained between the circle and the arc portion. From the fitted circle, the radius of the circle (for example, second radius R2: see FIG. 2) is calculated. The radius of the fitted circle is the radius of the arc portion. It should be noted that, instead of the edge profile monitor, a white light interferometric microscope manufactured by Nikon Corporation (model number: Nikon BW-503D) may be used. For example, using an image of first main surface 1a obtained with the white light interferometric microscope, a circle may be manually fitted to an arc portion, and the radius of the arc portion may be calculated from the fitted circle.

Next, a method for manufacturing the silicon carbide single crystal substrate in accordance with the embodiment will be described.

A substantially cylindrical ingot made of hexagonal silicon carbide having a polytype of 4H (not shown) is formed for example by a sublimation method. Next, a portion of the ingot is cut along a direction substantially parallel to an axis line of the substantially cylindrical ingot, to form an orientation flat portion. Next, the ingot having the orientation flat portion formed therein is sliced along a direction substantially perpendicular to the axis line, to cut out a plurality of silicon carbide single crystal substrates 1.

Figure 4:
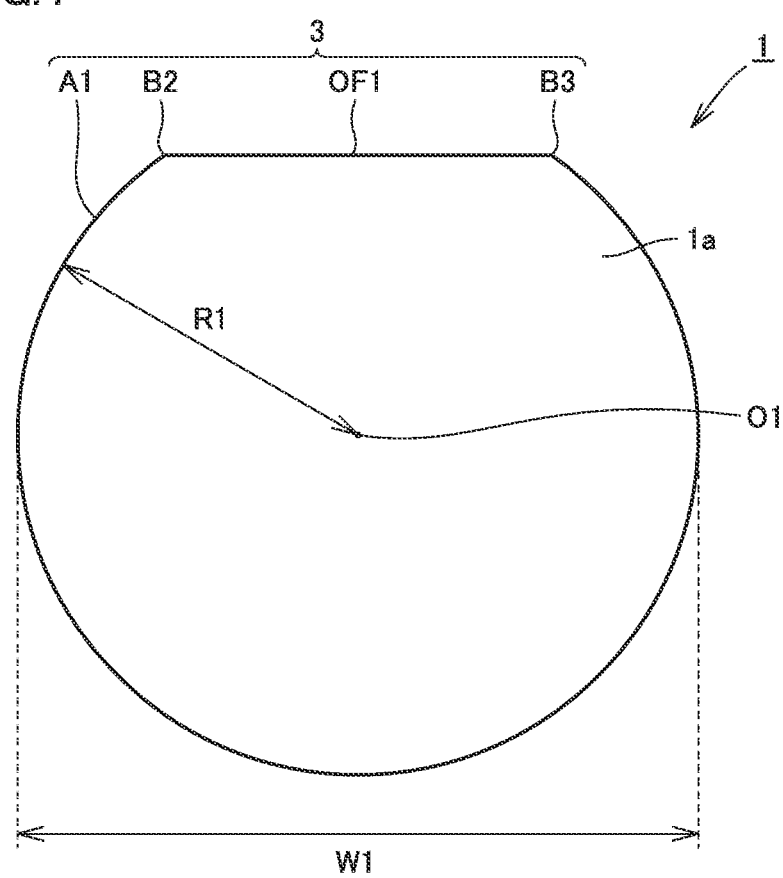
FIG. 4 is a schematic plan view showing a first step of a method for manufacturing the silicon carbide single crystal substrate in accordance with the embodiment.

Referring to FIGS. 4 and 5, silicon carbide single crystal substrate 1 has first main surface 1a, second main surface 1b opposite to first main surface 1a, and circumferential edge portion 3 connecting first main surface 1a and second main surface 1b. The material constituting silicon carbide single crystal substrate 1 is preferably hexagonal silicon carbide, and more preferably hexagonal silicon carbide having a polytype of 4H. Silicon carbide single crystal substrate 1 includes an n type impurity such as nitrogen (N), for example, and may have an n type conductivity type. First main surface 1a of silicon carbide single crystal substrate 1 is, for example, a {0001}plane, or a plane having an off angle of less than or equal to about 8° from the {0001}plane. First main surface 1a of silicon carbide single crystal substrate 1 is, for example, a (0001) plane, or a plane having an off angle of less than or equal to about 8° from the (0001) plane, and second main surface 1b is a (000−1) plane, or a plane having an off angle of less than or equal to about 8° from the (000−1) plane. First main surface 1a of silicon carbide single crystal substrate 1 may be, for example, a (000−1) plane, or a plane having an off angle of less than or equal to about 8° from the (000−1) plane, and second main surface 1b may be a (0001) plane, or a plane having an off angle of less than or equal to about 8° from the (0001) plane. As shown in FIG. 5, when viewed in a cross sectional view, first main surface 1a is substantially parallel to second main surface 1b. When viewed in a cross sectional view, circumferential edge portion 3 is substantially perpendicular to each of first main surface 1a and second main surface 1b.

Referring to FIG. 4, maximum diameter W1 of first main surface 1a is, for example, more than or equal to 100 mm and less than or equal to 200 mm, and preferably more than or equal to 150 mm and less than or equal to 200 mm. When viewed along the direction perpendicular to first main surface 1a, circumferential edge portion 3 has linear orientation flat portion OF1, first arc portion A1, contact point B2 between the one end portion of orientation flat portion OF1 and first arc portion A1, and a contact point B3 between the other end portion of orientation flat portion OF1 and first arc portion A1. First arc portion A1 is a portion of the circle which has first radius R1. First radius R1 is, for example, more than or equal to 50 mm and less than or equal to 100 mm.

Next, chamfering of circumferential edge portion 3 of silicon carbide single crystal substrate 1 is performed. Specifically, first arc portion A1, contact point B2, and orientation flat portion OF1 are ground while rotating silicon carbide single crystal substrate 1 about a rotation axis 1c perpendicular to first main surface 1a. Referring to FIG. 5, grindstone 2 having grinding surface 2a is prepared. Grindstone 2 is configured to be rotatable about a rotation axis 2b. As shown in FIG. 5, silicon carbide single crystal substrate 1 is arranged such that circumferential edge portion 3 of silicon carbide single crystal substrate 1 faces grinding surface 2a of grindstone 2.

Referring to FIG. 6, which is an enlarged view of the vicinity of grinding surface 2a of grindstone 2, grindstone 2 has a base metal 5, binder 6 provided on base metal 5, and a plurality of abrasive grains 7 fixed to base metal 5 with binder 6. Abrasive grains 7 are diamond, for example. As shown in FIG. 6, portions of abrasive grains 7 are buried in binder 6, and the remaining portions thereof are exposed from binder 6. Abrasive grains 7 abut on circumferential edge portion 3 of silicon carbide single crystal substrate 1. Preferably, binder 6 of grindstone 2 is a resin. Binder 6 using a resin is constituted by using a thermosetting resin such as phenol resin, for example, as a main material. Binder 6 is sintered at a temperature of, for example, more than or equal to about 150° C. and less than or equal to about 200° C. Binder 6 using a resin is highly strong and highly elastic, and thus can be more suitably used for grinding under a high circumferential speed condition than a binder using a metal.

TABLE 1

| Degree of Concentration | Abrasive Grain Density [volume %] | Diamond Content [ct./cm$^3$] |
| --- | --- | --- |
| 200 | 50 | 8.8 |
| 175 | 43.75 | 7.7 |
| 150 | 37.5 | 6.6 |
| 125 | 31.25 | 5.5 |
| 100 | 25 | 4.4 |
| 75 | 18.75 | 3.3 |
| 50 | 12.5 | 2.2 |
| 25 | 6.25 | 1.1 |

Preferably, grinding surface 2a of grindstone 2 has an abrasive grain density of more than or equal to 25 volume % and less than or equal to 32.5 volume %. The abrasive grain density is a ratio of abrasive grains included in an abrasive grain layer.

Table 1 shows a corresponding relation among the degree of concentration, the abrasive grain density, and the diamond content. For example, a diamond content of 4.4 ct. (carats)/cm$^3$ corresponds to a degree of concentration of 100 and an abrasive grain density of 25 volume %. Table 1 shows abrasive grain densities and diamond contents in cases where the degree of concentration is from 25 to 200.

Figure 10:
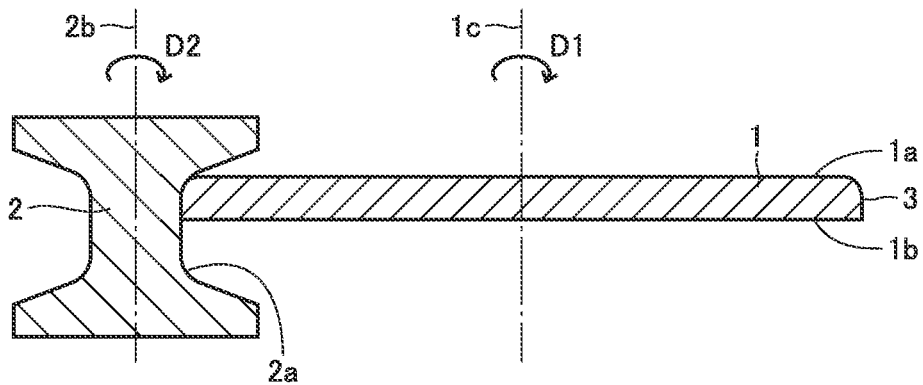
FIG. 10 is a schematic cross sectional view showing the second to fourth steps of the method for manufacturing the silicon carbide single crystal substrate in accordance with the embodiment.

Referring to FIGS. 7 and 10, circumferential edge portion 3 of silicon carbide single crystal substrate 1 is pressed against grinding surface 2a of grindstone 2 while rotating grindstone 2 about rotation axis 2b and rotating silicon carbide single crystal substrate 1 about rotation axis 1c. Rotation axis 2b of grindstone 2 is substantially parallel to rotation axis 1c of silicon carbide single crystal substrate 1. Rotation axis 1c of silicon carbide single crystal substrate 1 may pass through center O1 of first arc portion A1. As shown in FIG. 7, orientation flat portion OF1 is ground while pressing orientation flat portion OF1 of circumferential edge portion 3 on the first main surface 1a side against grinding surface 2a of grindstone 2 with a third force F3. The rotation speed of grindstone 2 is preferably more than or equal to 4000 rpm and less than or equal to 6000 rpm, and is 5000 rpm, for example. The rotation speed of silicon carbide single crystal substrate 1 is slower than the rotation speed of grindstone 2. The rotation speed of silicon carbide single crystal substrate 1 is 1 rpm, for example. Preferably, a rotation direction D2 of grindstone 2 is identical to a rotation direction D1 of silicon carbide single crystal substrate 1. Orientation flat portion OF1 is ground from the one end portion to the other end portion.

Figure 8:
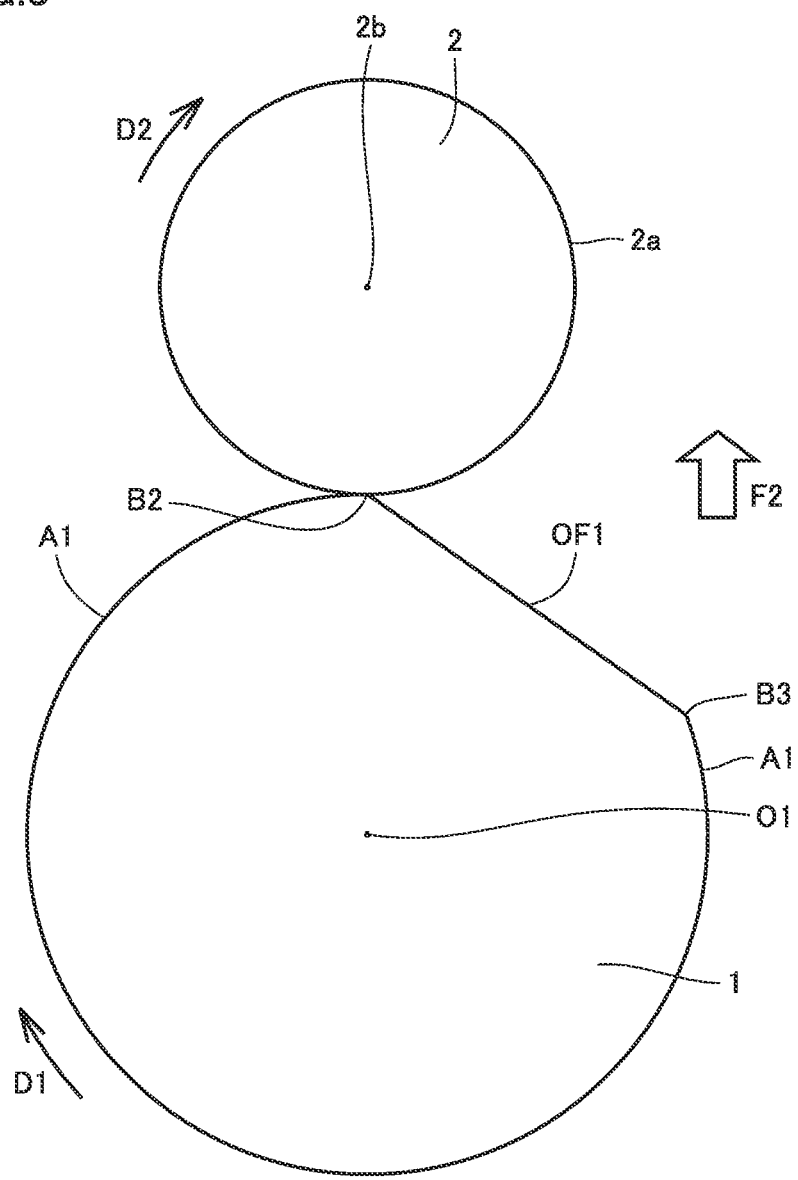
FIG. 8 is a schematic plan view showing a third step of the method for manufacturing the silicon carbide single crystal substrate in accordance with the embodiment.

Next, contact point B2 between orientation flat portion OF1 and first arc portion A1 on the first main surface 1a side is ground. Referring to FIGS. 8 and 10, contact point B2 is ground by pressing contact point B2 against grinding surface 2a of grindstone 2 with a second force F2 while rotating grindstone 2 about rotation axis 2b and rotating silicon carbide single crystal substrate 1 about rotation axis 1c. Preferably, third force F3 is greater than second force F2. Preferably, the rotation speed of silicon carbide single crystal substrate 1 in grinding contact point B2 is lower than the rotation speed of silicon carbide single crystal substrate 1 in grinding orientation flat portion OF1. That is, after grinding of orientation flat portion OF1 is finished, grinding of contact point B2 is started with the rotation speed of silicon carbide single crystal substrate 1 being decreased.

Figure 9:
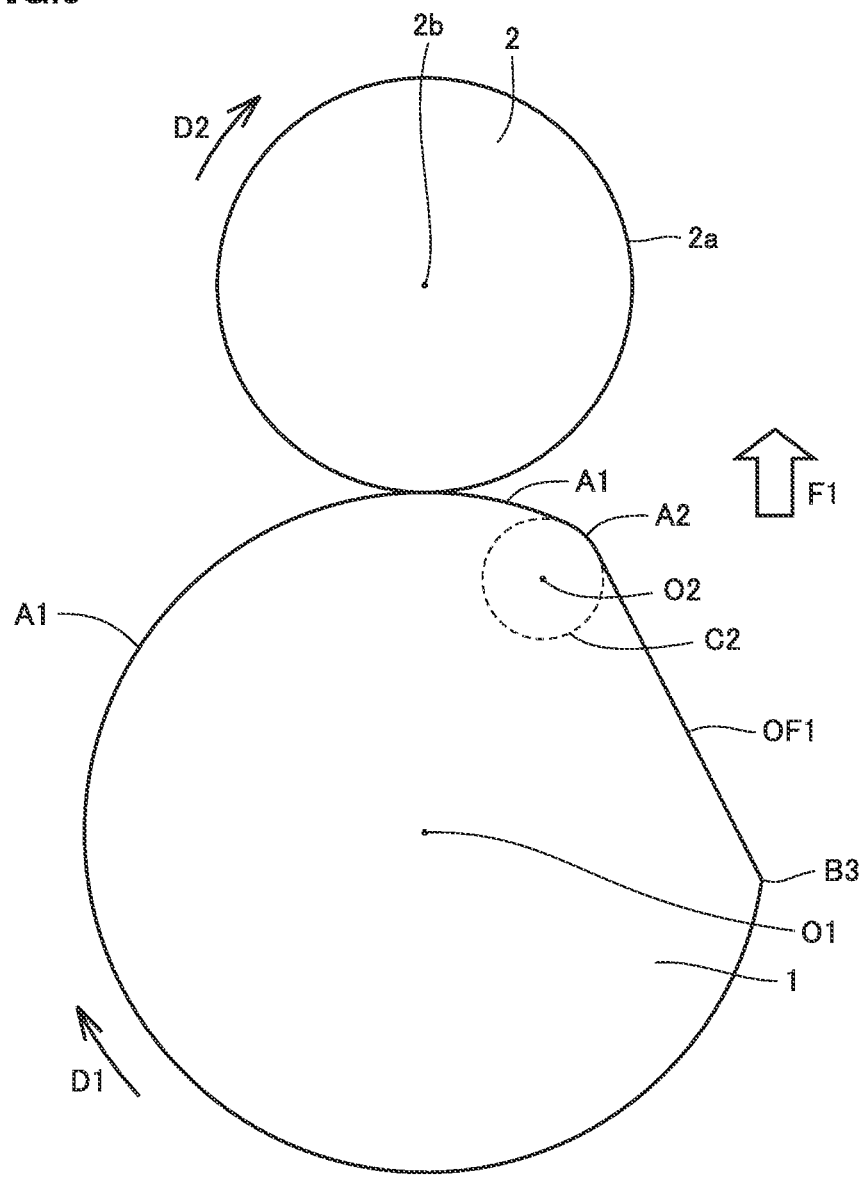
FIG. 9 is a schematic plan view showing a fourth step of the method for manufacturing the silicon carbide single crystal substrate in accordance with the embodiment.

Next, first arc portion A1 on the first main surface 1a side is ground. Referring to FIGS. 9 and 10, first arc portion A1 is ground by pressing first arc portion A1 against grinding surface 2a of grindstone 2 with a first force F1 while rotating grindstone 2 about rotation axis 2b and rotating silicon carbide single crystal substrate 1 about rotation axis 1c. Preferably, second force F2 is greater than first force F1. Preferably, the rotation speed of silicon carbide single crystal substrate 1 in grinding contact point B2 is lower than the rotation speed of silicon carbide single crystal substrate 1 in grinding first arc portion A1. That is, after grinding of contact point B2 is finished, first arc portion A1 is ground with the rotation speed of silicon carbide single crystal substrate 1 being increased. As silicon carbide single crystal substrate 1 is rotated, first arc portion A1 is ground from one end portion to the other end portion thereof.

Next, contact point B3 between orientation flat portion OF1 and first arc portion A1 on the first main surface 1a side is ground. Contact point B3 is ground by pressing contact point B3 against grinding surface 2a of grindstone 2 with second force F2 while rotating grindstone 2 about rotation axis 2b and rotating silicon carbide single crystal substrate 1 about rotation axis 1c. Preferably, the rotation speed of silicon carbide single crystal substrate 1 in grinding contact point B3 is lower than the rotation speed of silicon carbide single crystal substrate 1 in each of grinding orientation flat portion OF1 and grinding first arc portion A1. That is, after grinding of first arc portion A1 is finished, grinding of contact point B3 is started with the rotation speed of silicon carbide single crystal substrate 1 being decreased.

As described above, by rotating silicon carbide single crystal substrate 1 about rotation axis 1c by 360° with circumferential edge portion 3 on the first main surface 1a side being pressed against grinding surface 2a of grindstone 2, the entire circumference of circumferential edge portion 3 on the first main surface 1a side is chamfered. As shown in FIG. 10, since circumferential edge portion 3 on the first main surface 1a side of silicon carbide single crystal substrate 1 is chamfered, circumferential edge portion 3 on the first main surface 1a side has a round shape. On the other hand, circumferential edge portion 3 on the second main surface 1b side is not chamfered yet. Therefore, when viewed in a cross sectional view, an angle formed by circumferential edge portion 3 and second main surface 1b is about 90°.

Figure 11:
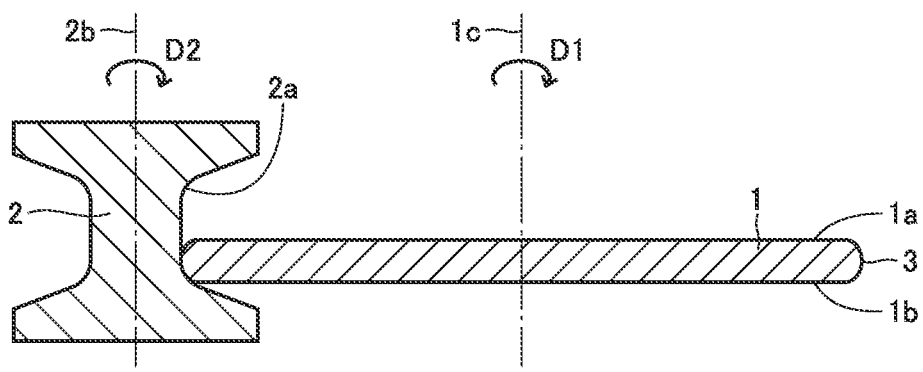
FIG. 11 is a schematic cross sectional view showing a fifth step of the method for manufacturing the silicon carbide single crystal substrate in accordance with the embodiment.

Next, chamfering of circumferential edge portion 3 on the second main surface 1b side is performed. Referring to FIG. 11, the position of silicon carbide single crystal substrate 1 is lowered such that circumferential edge portion 3 on the second main surface 1b side of silicon carbide single crystal substrate 1 abuts on grinding surface 2a of grindstone 2. Referring to FIGS. 7 and 11, orientation flat portion OF1 of silicon carbide single crystal substrate 1 is pressed against grinding surface 2a of grindstone 2 while rotating grindstone 2 about rotation axis 2b and rotating silicon carbide single crystal substrate 1 about rotation axis 1c. Orientation flat portion OF1 is ground while pressing orientation flat portion OF1 on the second main surface 1b side against grinding surface 2a of grindstone 2 with third force F3. The rotation speed of grindstone 2 is preferably more than or equal to 4000 rpm and less than or equal to 6000 rpm, and is 5000 rpm, for example. The rotation speed of silicon carbide single crystal substrate 1 is slower than the rotation speed of grindstone 2. The rotation speed of silicon carbide single crystal substrate 1 is 1 rpm, for example. Preferably, rotation direction D2 of grindstone 2 is identical to rotation direction D1 of silicon carbide single crystal substrate 1. Orientation flat portion OF1 is ground from the one end portion to the other end portion.

Next, contact point B2 between orientation flat portion OF1 and first arc portion A1 on the second main surface 1b side is ground. Referring to FIGS. 8 and 11, contact point B2 is ground by pressing contact point B2 against grinding surface 2a of grindstone 2 with second force F2 while rotating grindstone 2 about rotation axis 2b and rotating silicon carbide single crystal substrate 1 about rotation axis 1c. Preferably, third force F3 is greater than second force F2. Preferably, the rotation speed of silicon carbide single crystal substrate 1 in grinding contact point B2 is lower than the rotation speed of silicon carbide single crystal substrate 1 in grinding orientation flat portion OF1. That is, after grinding of orientation flat portion OF1 is finished, grinding of contact point B2 is started with the rotation speed of silicon carbide single crystal substrate 1 being decreased.

Next, first arc portion A1 on the second main surface 1b side is ground. Referring to FIGS. 9 and 11, first arc portion A1 is ground by pressing first arc portion A1 against grinding surface 2a of grindstone 2 with first force F1 while rotating grindstone 2 about rotation axis 2b and rotating silicon carbide single crystal substrate 1 about rotation axis 1c. Preferably, second force F2 is greater than first force F1. Preferably, the rotation speed of silicon carbide single crystal substrate 1 in grinding contact point B2 is lower than the rotation speed of silicon carbide single crystal substrate 1 in grinding first arc portion A1. That is, after grinding of contact point B2 is finished, first arc portion A1 is ground with the rotation speed of silicon carbide single crystal substrate 1 being increased. As silicon carbide single crystal substrate 1 is rotated, first arc portion A1 is ground from one end portion to the other end portion thereof.

Figure 12:
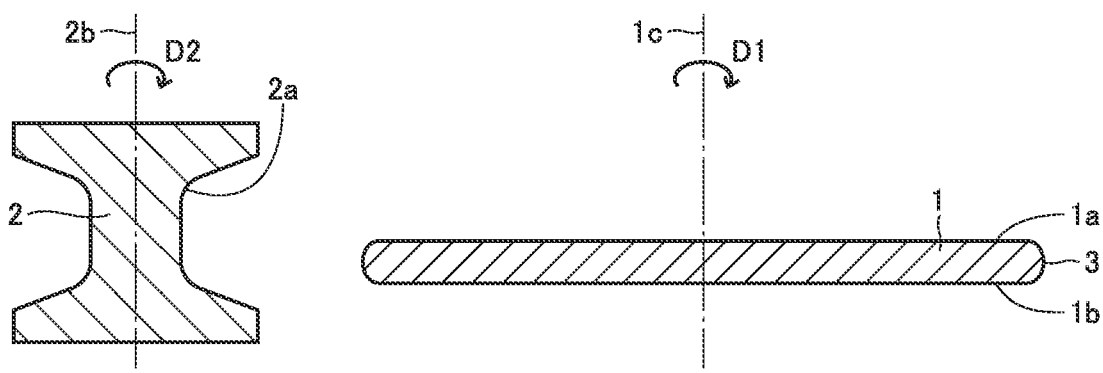
FIG. 12 is a schematic cross sectional view showing a sixth step of the method for manufacturing the silicon carbide single crystal substrate in accordance with the embodiment.

Next, contact point B3 between orientation flat portion OF1 and first arc portion A1 on the second main surface 1b side is ground. Contact point B3 is ground by pressing contact point B3 against grinding surface 2a of grindstone 2 with second force F2 while rotating grindstone 2 about rotation axis 2b and rotating silicon carbide single crystal substrate 1 about rotation axis 1c. Preferably, the rotation speed of silicon carbide single crystal substrate 1 in grinding contact point B3 is lower than the rotation speed of silicon carbide single crystal substrate 1 in each of grinding orientation flat portion OF1 and grinding first arc portion A1. That is, after grinding of first arc portion A1 is finished, grinding of contact point B3 is started with the rotation speed of silicon carbide single crystal substrate 1 being decreased. As described above, by rotating silicon carbide single crystal substrate 1 about rotation axis 1c by 360° with circumferential edge portion 3 on the second main surface 1b side being pressed against grinding surface 2a of grindstone 2, the entire circumference of circumferential edge portion 3 on the second main surface 1b side is chamfered. Eventually, both the entire circumference of circumferential edge portion 3 on the first main surface 1a side and the entire circumference of circumferential edge portion 3 on the second main surface 1b side are chamfered. Referring to FIG. 12, after chamfering of the entire circumference of circumferential edge portion 3 is finished, circumferential edge portion 3 of silicon carbide single crystal substrate 1 is detached from grinding surface 2a of grindstone 2.

As described above, by grinding first arc portion A1, contact point B2, and orientation flat portion OF1, second arc portion A2 connecting orientation flat portion OF1 and first arc portion A1 and having second radius R2 smaller than first radius F1 is formed (see FIG. 1).

It should be noted that, although the embodiment described above has described a case where silicon carbide single crystal substrate 1 is rotated clockwise when viewed from the first main surface 1a side, silicon carbide single crystal substrate 1 may be rotated counter-clockwise when viewed from the first main surface 1a side. Further, although the embodiment described above has described a case where circumferential edge portion 3 on the first main surface 1a side is ground and thereafter circumferential edge portion 3 on the second main surface 1b side is ground, circumferential edge portion 3 on the second main surface 1b side may be ground and thereafter circumferential edge portion 3 on the first main surface 1a side may be ground. Furthermore, both circumferential edge portion 3 on the first main surface 1a side and circumferential edge portion 3 on the second main surface 1b side may be ground simultaneously.

Next, the function and effect of the silicon carbide single crystal substrate in accordance with the present embodiment and the method for manufacturing the same will be described.

According to silicon carbide single crystal substrate 1 in accordance with the present embodiment, circumferential edge portion 3 has linear orientation flat portion OF1, first arc portion A1 having first radius R1, and second arc portion A2 connecting orientation flat portion OF1 and first arc portion A1 and having second radius R2 smaller than first radius R1. Thereby, occurrence of a level difference in a surface of a silicon carbide epitaxial film formed on silicon carbide single crystal substrate 1 can be effectively suppressed.

Further, according to silicon carbide single crystal substrate 1 in accordance with the present embodiment, second radius R2 is more than or equal to 50 μm and less than or equal to 500 μm. When second radius R2 is more than or equal to 50 μm, damage in the vicinity of a contact point can be removed effectively, and thus occurrence of a level difference in the surface of the epitaxial film can be suppressed more effectively. When second radius R2 is less than or equal to 500 μm, occurrence of misalignment due to too short linear orientation flat portion OF1 can be suppressed.

Furthermore, according to silicon carbide single crystal substrate 1 in accordance with the present embodiment, first main surface 1a has maximum diameter W1 of more than or equal to 100 mm and less than or equal to 200 mm. When first main surface 1a has large maximum diameter W1, the angle formed by first arc portion A1 and orientation flat portion OF1 becomes small and the vicinity of the contact point becomes sharp, and thus chipping is likely to occur in the vicinity of the contact point. Therefore, it is possible to particularly effectively suppress occurrence of a level difference in the surface of the silicon carbide epitaxial film in silicon carbide single crystal substrate 1 whose first main surface 1a has maximum diameter W1 of more than or equal to 100 mm and less than or equal to 200 mm.

Furthermore, according to silicon carbide single crystal substrate 1 in accordance with the present embodiment, the material constituting silicon carbide single crystal substrate 1 is hexagonal silicon carbide. Orientation flat portion OF1 is located in the [1–100] direction when viewed from center of gravity G of silicon carbide single crystal substrate 1. In this case, second arc portion A2 is located in the [11–20] direction when viewed from center of gravity G. Hexagonal silicon carbide has a property that it is easily cleaved at a position in the [11–20] orientation. Accordingly, chipping can be effectively suppressed by providing second arc portion A2 at that position.

According to the method for manufacturing silicon carbide single crystal substrate 1 in accordance with the present embodiment, first arc portion A1, contact point B2, and orientation flat portion OF1 are ground while rotating silicon carbide single crystal substrate 1. Second arc portion A2 connecting orientation flat portion OF1 and first arc portion A1 and having second radius R2 smaller than first radius R1 is formed by grinding first arc portion A1, contact point B2, and orientation flat portion OF1. Thereby, occurrence of a level difference in the surface of the silicon carbide epitaxial film formed on silicon carbide single crystal substrate 1 can be effectively suppressed.

Further, according to the method for manufacturing silicon carbide single crystal substrate 1 in accordance with the present embodiment, grinding first arc portion A1, contact point B2, and orientation flat portion OF1 includes grinding first arc portion A1 while pressing first arc portion A1 against grindstone 2 with the first force, grinding contact point B2 while pressing contact point B2 against grindstone 2 with the second force, and grinding orientation flat portion OF1 while pressing orientation flat portion OF1 against the grindstone with the third force. The second force is greater than the first force, and the third force is greater than the second force. Thereby, second arc portion A2 can be efficiently formed while preventing a crack and a chip in silicon carbide single crystal substrate 1.

Furthermore, according to the method for manufacturing silicon carbide single crystal substrate 1 in accordance with the present embodiment, binder 6 of grindstone 2 is a resin. Binder 6 using a resin is highly strong and highly elastic, and thus can be more suitably used for grinding under a high circumferential speed condition than a binder using a metal.

Furthermore, according to the method for manufacturing silicon carbide single crystal substrate 1 in accordance with the present embodiment, grinding surface 2a of grindstone 2 abutting on circumferential edge portion 3 has an abrasive grain density of more than or equal to 25 volume % and less than or equal to 32.5 volume %. Thereby, second arc portion A2 can be efficiently formed by excessively pressing circumferential edge portion 3 against grinding surface 2a of grindstone 2 with cutting ability being enhanced.

Furthermore, according to the method for manufacturing silicon carbide single crystal substrate 1 in accordance with the present embodiment, in grinding first arc portion A1, contact point B2, and orientation flat portion OF1, first arc portion A1, contact point B2, and orientation flat portion OF1 are ground while rotating silicon carbide single crystal substrate 1. The rotation speed of silicon carbide single crystal substrate 1 in grinding contact point B2 is lower than the rotation speed of silicon carbide single crystal substrate 1 in each of grinding first arc portion A1 and grinding orientation flat portion OF1. Thereby, second arc portion A2 can be efficiently formed while preventing a crack and a chip in silicon carbide single crystal substrate 1.

Furthermore, according to the method for manufacturing silicon carbide single crystal substrate 1 in accordance with the present embodiment, in grinding first arc portion A1, contact point B2, and orientation flat portion OF1, the entire circumference of circumferential edge portion 3 is chamfered. Thereby, silicon carbide single crystal substrate 1 having circumferential edge portion 3 whose circumference is entirely chamfered can be formed.

Furthermore, according to the method for manufacturing silicon carbide single crystal substrate 1 in accordance with the present embodiment, first main surface 1a has a maximum diameter of more than or equal to 100 mm and less than or equal to 200 mm. When first main surface 1a has large maximum diameter W1, the angle formed by first arc portion A1 and orientation flat portion OF1 becomes small and the vicinity of the contact point becomes sharp, and thus chipping is likely to occur in the vicinity of the contact point. Therefore, it is possible to particularly effectively suppress occurrence of a level difference in the surface of the silicon carbide epitaxial film in silicon carbide single crystal substrate 1 whose first main surface 1a has maximum diameter W1 of more than or equal to 100 mm and less than or equal to 200 mm.

Example

First, six types of silicon carbide single crystal substrates 1 including second arc portions A2 having different second radii R2 (see FIG. 1) were prepared. Second radii R2 were set to 0 µm, 50 µm, 100 µm, 200 µm, 500 µm, and 1000 µm. Silicon carbide single crystal substrate 1 having second radius R2 of 0 µm (a comparative example) was fabricated without grinding contact points B2, B3 between orientation flat portion OF1 and first arc portion A1. Silicon carbide single crystal substrates 1 having second radii R2 of more than or equal to 50 µm and less than or equal to 1000 µm were fabricated with grinding contact points B2, B3 between orientation flat portion OF1 and first arc portion A1 by the method described in the above embodiment. After grinding circumferential edge portion 3 of each silicon carbide single crystal substrate 1, a silicon carbide epitaxial film was formed on first main surface 1a of each of the six types of silicon carbide single crystal substrates 1. The silicon carbide epitaxial film had a thickness of 15 µm.

After fabricating the six types of silicon carbide single crystal substrates 1, the presence or absence of chipping in the vicinity of the contact points between orientation flat portion OF1 and first arc portion A1 in first main surface 1a was investigated using an optical microscope. When there was chipping having a length of more than or equal to 50 µM in a direction parallel to first main surface 1a, it was determined that chipping was present, and when there was no chipping having a length of more than or equal to 50 µm, it was determined that chipping was absent. Similarly, the presence or absence of unevenness (slip) in a surface of the silicon carbide epitaxial film formed on each silicon carbide single crystal substrate 1 was investigated. When there was a level difference of more than or equal to 1 µm in a direction perpendicular to first main surface 1a, it was determined that unevenness was present, and when there was no level difference of more than or equal to 1 µm, it was determined that unevenness was absent.

The presence or absence of chipping and the presence or absence of unevenness in the surface of the epitaxial film in the six types of silicon carbide single crystal substrates 1 will be described with reference to Table 2.

TABLE 2

| | Second Radius [µm] | | | | | |
|---|---|---|---|---|---|---|
| | 0 | 50 | 100 | 250 | 500 | 1000 |
| Chipping | Present | Absent | Absent | Absent | Absent | Absent |
| Unevenness in Surface of Epitaxial Film | Present | Absent | Absent | Absent | Absent | Absent |

As shown in Table 2, in the case of silicon carbide single crystal substrate 1 having second radius R2 of 0 µm (that is, in the case where contact points B2, B3 between orientation flat portion OF1 and first arc portion A1 were not ground), chipping of more than or equal to 50 µm was observed in the vicinity of the contact points between orientation flat portion OF1 and first arc portion A1. Further, a level difference of more than or equal to 1 µm was observed in the surface of the epitaxial film formed on silicon carbide single crystal substrate 1. In contrast, in the case of silicon carbide single crystal substrates 1 having second radii R2 of more than or equal to 50 μm and less than or equal to 1000 μm, chipping of more than or equal to 50 μm was not observed in the vicinity of the contact points between orientation flat portion OF1 and first arc portion A1. Further, a level difference of more than or equal to 1 μm was not observed in the surface of the epitaxial film formed on each silicon carbide single crystal substrate 1.

From the above results, it was confirmed that occurrence of chipping and a level difference in the surface of the epitaxial film can be effectively suppressed by setting second radius R2 to more than or equal to 50 μm and less than or equal to 1000 μm. Further, when second radius R2 is more than 500 μm, linear orientation flat portion OF1 has a relatively short length. Thus, misalignment may occur when silicon carbide single crystal substrate 10 is aligned with a manufacturing apparatus using orientation flat portion OF1 as a reference. Therefore, second radius R2 is preferably more than or equal to 50 μm and less than or equal to 500 μm.

It should be understood that the embodiment and the example disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: silicon carbide single crystal substrate; 1*a*: first main surface; 1*b*: second main surface; 1*c*, 2*b*: rotation axis; 2: grindstone; 2*a*: grinding surface; 3: circumferential edge portion; 5: base metal; 6: binder; 7: abrasive grains; A1: first arc portion; A2: second arc portion; A3: third arc portion; A4: fourth arc portion; A5: fifth arc portion; A6: sixth arc portion; B2, B3: contact point; D1, D2: rotation direction; F1: first force; F2: second force; F3: third force; G: center of gravity; O1, O2, O3, O4, O5: center; OF1: orientation flat portion; OF2: second orientation flat portion; R1: first radius; R2: second radius; R3: third radius; R4: fourth radius; R5: fifth radius; W1: maximum diameter.

The invention claimed is:

1. A silicon carbide single crystal substrate, comprising:
a first main surface;
a second main surface opposite to the first main surface; and
a circumferential edge portion connecting the first main surface and the second main surface,
the circumferential edge portion having a linear orientation flat portion, a first arc portion having a first radius, and a second arc portion connecting the linear orientation flat portion and the first arc portion and having a second radius smaller than the first radius, when viewed along a direction perpendicular to the first main surface,
wherein the second radius is more than or equal to 50 μm and less than or equal to 1000 μm,
wherein a material constituting the silicon carbide single crystal substrate is hexagonal silicon carbide,
the linear orientation flat portion is located in a [1-100] direction with respect to a center of gravity of the silicon carbide single crystal substrate, and
wherein the linear orientation flat portion has a length which extends in a first direction perpendicular to the [1-100] direction from a top view, and has a height which extends in a second direction perpendicular to the [1-100] direction from the top view.

2. The silicon carbide single crystal substrate according to claim 1, wherein the second radius is less than or equal to 500 μm.

3. The silicon carbide single crystal substrate according to claim 1, wherein the first main surface has a maximum diameter range of more than or equal to 100 mm and less than or equal to 200 mm.

\* \* \* \* \*